United States Patent [19]

Capek

[11] 3,959,725
[45] May 25, 1976

[54] DISTRIBUTOR VOLTAGE SENSOR
[75] Inventor: William J. Capek, Bridgeview, Ill.
[73] Assignee: Sun Electric Corporation, Chicago, Ill.
[22] Filed: Apr. 29, 1974
[21] Appl. No.: 465,123

[52] U.S. Cl. .............................................. 324/16 S
[51] Int. Cl.² ........................................ G01R 13/42
[58] Field of Search ................ 324/15, 16 R, 16 T, 324/16 S, 17, 18

[56] References Cited
UNITED STATES PATENTS
3,793,583  2/1974  Glomski et al. ...................... 324/15

Primary Examiner—Stanley T. Krawczewicz
Attorney, Agent, or Firm—Allegretti, Newitt, Witcoff & McAndrews

[57] ABSTRACT
The disclosure describes an ignition system for an internal combustion engine fitted with a plurality of spark plugs. The engine rotates a distributor that includes a primary coil which induces voltages in a secondary coil. The secondary coil voltages are sequentially distributed to the spark plugs in order to operate the engine. The engine is provided with a source of common potential, generally referred to as chassis ground.

Improved apparatus for displaying the waveform of the voltage produced by the secondary coil includes an oscilloscope having a first input and a second input. A conductive probe is positioned close to the secondary coil, and a single conductor operatively connects the probe to the first input of the oscilloscope. A second conductor operatively connects the second input of the oscilloscope to chassis ground so that the waveform of the voltage produced by the secondary coil is displayed on the oscilloscope.

6 Claims, 8 Drawing Figures

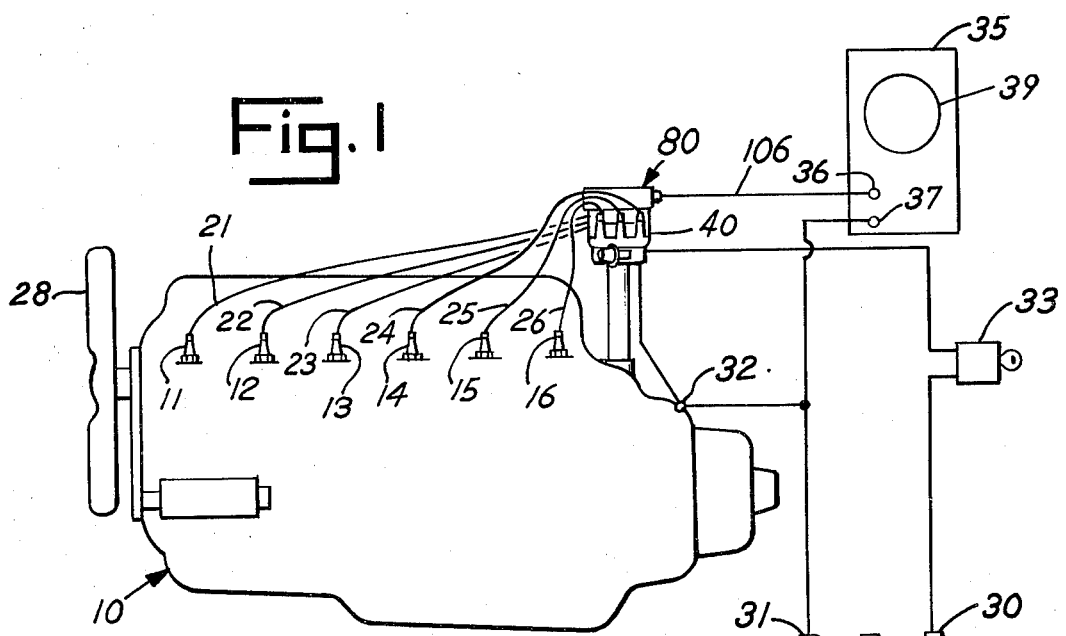
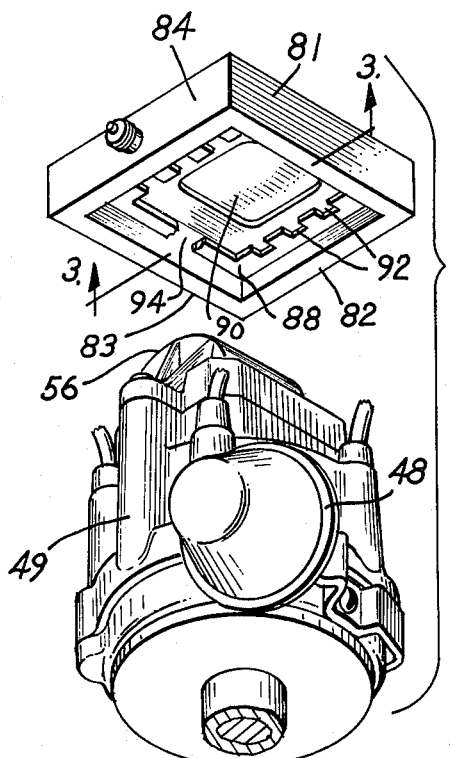
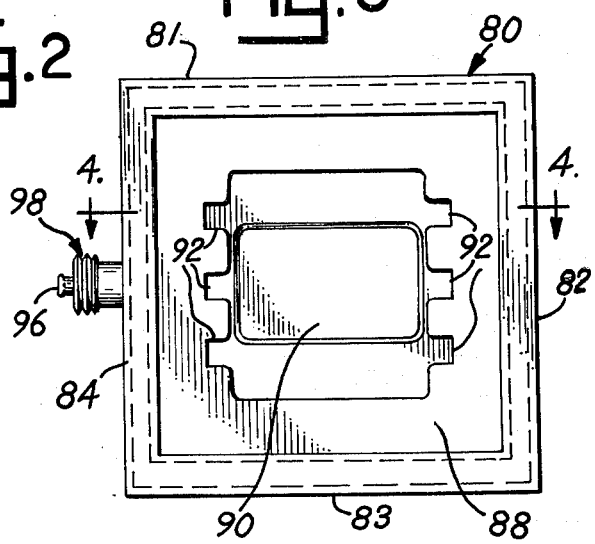
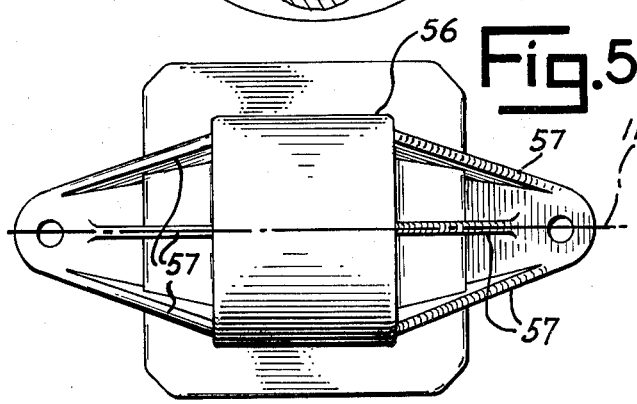
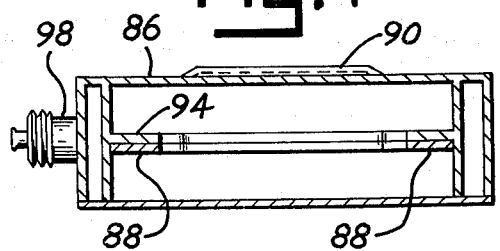

DISTRIBUTOR VOLTAGE SENSOR

BACKGROUND AND SUMMARY OF THE INVENTION

This invention relates to testing apparatus for internal combustion engines and more particularly relates to apparatus for displaying voltage waveforms derived from the ignition systems of internal combustion engines.

Vehicular ignition systems basically consist of a battery, a distributor including primary and secondary coils, means for periodically commencing and terminating the conduction of current through the primary coil so that a high voltage is induced in the secondary coil and a spark plug for each individual cylinder of the vehicular engine. The distributor is connected to each spark plug by a wire or lead.

One way to diagnose the system's condition is to study the voltage waveforms at various points in the system. The waveforms are usually coupled from these points and displayed on a cathode ray tube of a conventional oscilloscope. One of the most useful waveforms is generated by the secondary coil of the distributor. In the past, the secondary coil and distributor have been manufactured as individually separate units. The secondary coil is normally connected to the distributor cap by a high tension lead.

In such a system, there are two common methods for obtaining a display of the secondary coil voltage waveform:

The first method is to insert a coupling transformer in series with the high tension lead between the secondary coil and the distributor cap. This is accomplished by removing the high tension lead from the coil tower. A specially constructed coupling transformer is then inserted into the coil tower, and the high tension lead is reinserted into the coupling transformer to complete a series circuit between the secondary coil and the distributor. The voltage waveform from the coupling transformer is coupled to an oscilloscope and is displayed.

The second method uses a capacitive-type pick-up which fits around or clamps onto the high tension lead. A typical pick-up of this type is illustrated in U.S. Pat. No. 3,477,024 (Pelta — Nov. 4, 1969). Such a probe operates on the principal of a capacitor and has two opposed metallic plates which are separated by the high tension lead when the device is properly positioned. The opposed plates of the pick-up are capable of responding to time-varying electric fields like a conventional capacitor.

Recently, automobile manufacturers have developed a "unitized" ignition distributor in which the distributor primary and secondary coils are integrally formed within the distributor cap. As a result, there is no external high tension lead between the primary and secondary coils and the distributor cap. Therefore, neither a series coupling transformer nor a clamp-on capacitive pick-up are useful.

Accordingly, it is a primary object of the present invention to provide a sensor capable of responding to the time-varying electrical phenomenon produced by the secondary coil of a distributor without employing either a transformer or a capacitive pick-up.

It is another object of the present invention to provide a sensor of the foregoing type in which no direct access to the conductor connecting the secondary coil to the distributor cap is required.

It is still another object of the present invention to provide a probe of the foregoing type which produces voltages capable of being displayed on an oscilloscope.

DESCRIPTION OF THE DRAWINGS

These and other objects, advantages and features of the invention will appear in connection with the accompanying drawings wherein:

FIG. 1 is a schematic diagram illustrating a preferred form of sensor made in accordance with the present invention mounted on a unitized distributor of a conventional internal combustion engine;

FIG. 2 is a fragmentary, isometric, exploded view of the distributor and sensor shown in FIG. 1;

FIG. 3 is a bottom plan view of the sensor shown in FIG. 2;

FIG. 4 is a cross-sectional view taken along line 4—4 in FIG. 3;

FIG. 5 is a top plan view of the distributor shown in FIG. 2;

DESCRIPTION OF THE PREFERRED EMBODIMENT

Figure 6:
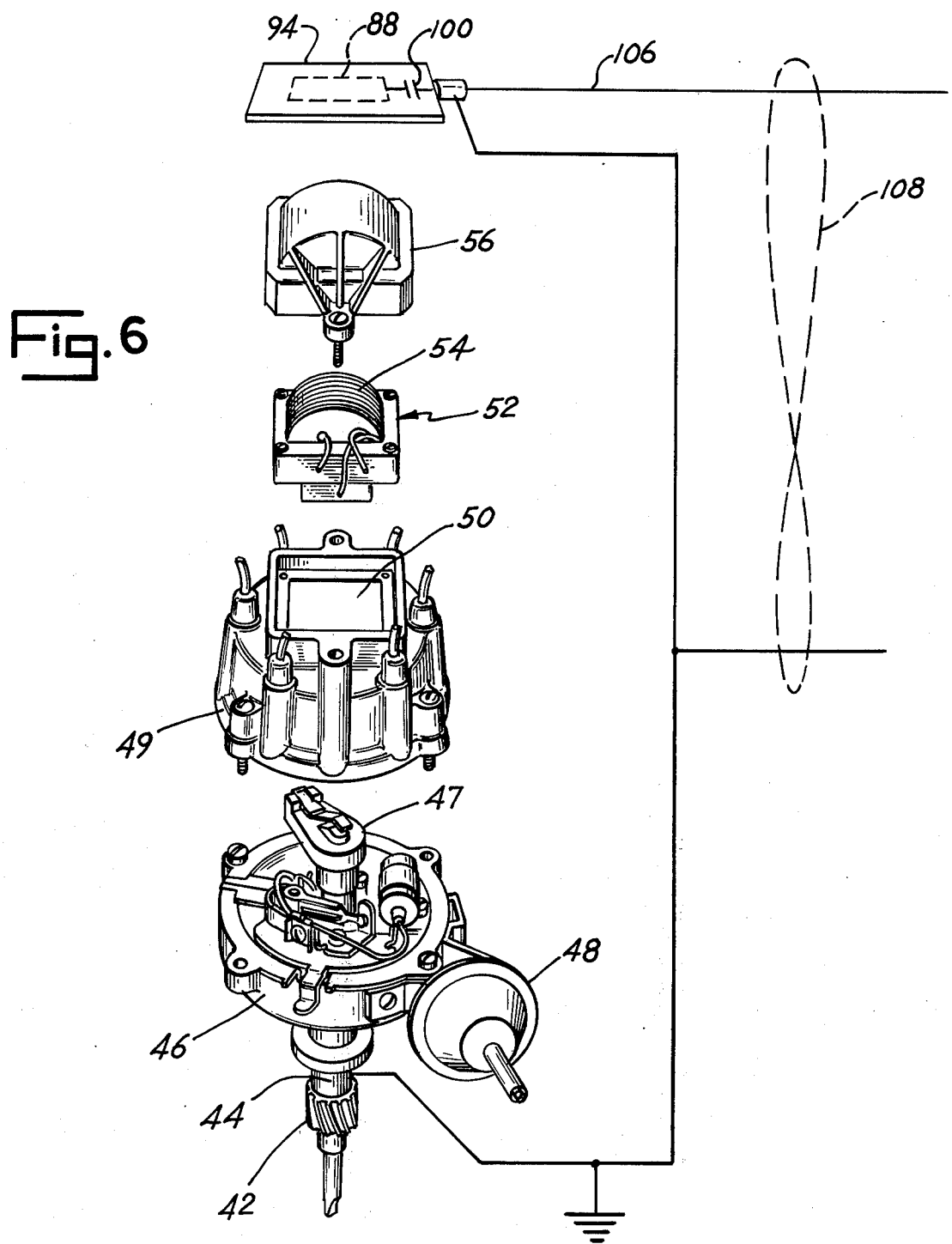
FIG. 6 is an exploded view of the distributor shown in FIG. 2, together with a fragmentary, electrical schematic view of the sensor shown in FIG. 2.

Referring to FIG. 1, a preferred form of the invention may be used in connection with a conventional 6 cylinder internal combustion engine 10 comprising spark plugs 11–16 that are supplied with high voltage pulses through spark plug leads 21–26, respectively. The engine is fitted with a fan blade 28 and a storage battery 29 having a positive terminal 30 and a negative terminal 31. A source of common potential or chassis ground 32 is connected to negative terminal 31. Positive terminal 30 is connected to a conventional ignition switch 33. Voltage waveforms generated by the ignition system of the engine can be displayed on the face of a cathode ray tube 39 included within a conventional oscilloscope 35 having a positive input 36 and a negative input 37.

Figure 7:
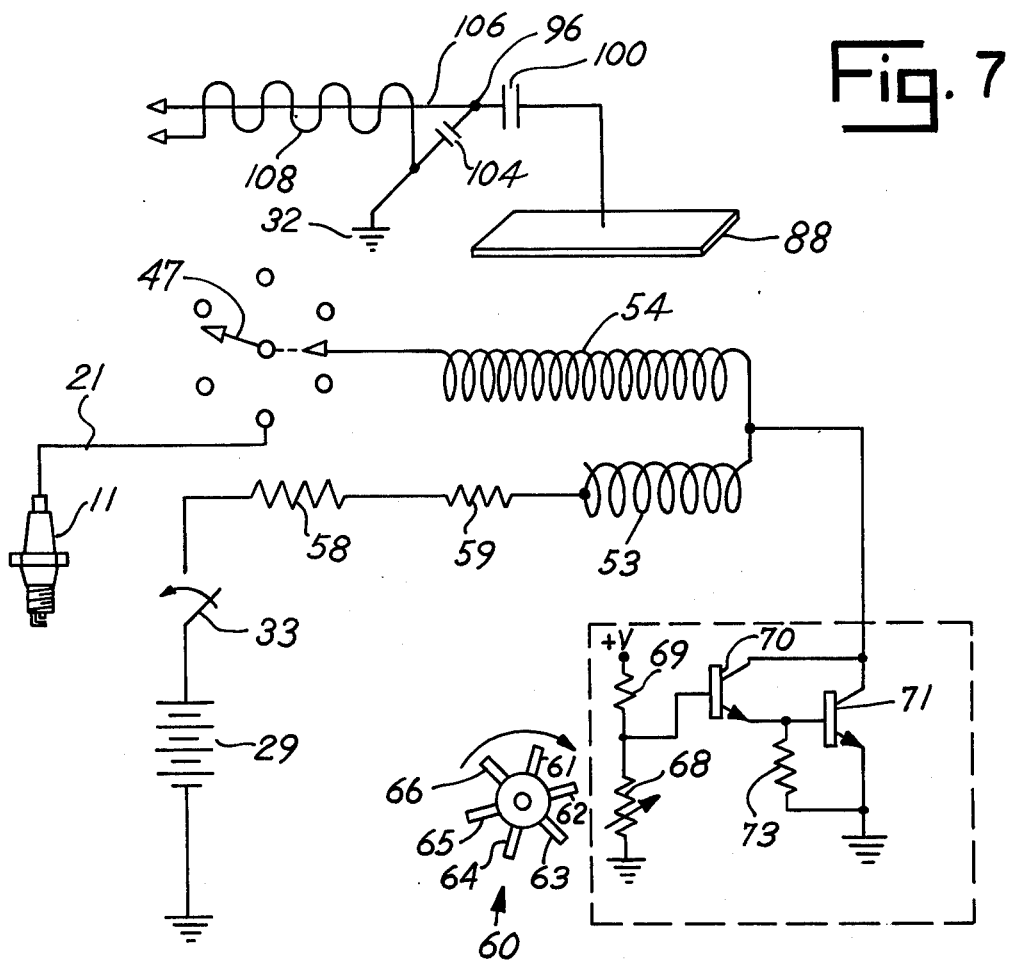
FIG. 7 is a fragmentary, electrical schematic view of the distributor shown in FIG. 2, together with the sensor shown in FIG. 2.

Engine 10 is fitted with a unitized distributor 40 shown in more detail in FIGS. 2, 6 and 7. The distributor comprises a gear 42 which is turned by the engine. The gear, in turn, rotates a shaft 44. A housing 46 is positioned on top of the shaft. A rotor 47 is turned by the shaft in a conventional manner, and the spark advance of the distributor is controlled by a vacuum unit 48. A distributor cap 49 holds the ends of the spark plug wires adjacent the revolving rotor so that high voltage pulses are sequentially distributed to the spark plugs in a well-known manner. Cap 49 includes a cavity 50 which houses a coil assembly 52 comprising a primary coil 53 and a cylindrical secondary coil 54 wound on a common iron core (not shown) so that the coils are magnetically coupled. The coils are covered by a cylindrical cover 56 including ribs 57.

Referring to FIG. 7, an electrical circuit for commencing and terminating current flow through primary coil 53 comprises resistors 58, 59 and a trigger wheel 60 including lobes 61–66 that are driven in synchronism with the rotation of the engine. The lobes induce a voltage in additional circuitry (not shown) which results in voltage pulses at the junction of resistors 68 and 69. In response to the voltage pulses, transistors 70, 71 are switched between their conductive and nonconductive states and are further controlled by a resistor 73. The electronic circuits used to control coils 53 and 54 are generally more detailed than the circuitry shown in FIG. 7, but such circuits are well known in the art.

Figure 8:
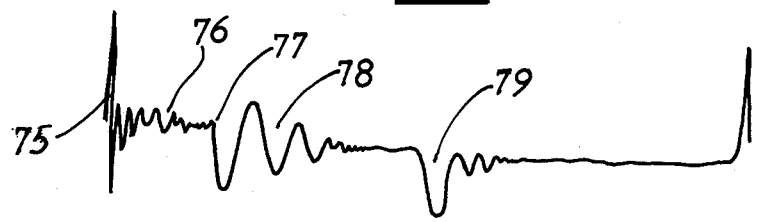
FIG. 8 is an illustration of an exemplary voltage waveform produced by the secondary coil shown in FIG. 7.

FIG. 8 illustrates a typical voltage waveform produced by secondary coil 54. Portion 75 of the waveform represents a rapid increase in voltage due to the interruption of current flow through primary coil 53. Portion 76 indicates the voltage while a spark plug is firing. Portion 77 indicates the rapid decrease in voltage in the secondary coil when a spark plug ceases firing. Portion 78 indicates the voltage induced in the secondary coil by the primary coil after a spark plug has stopped firing, and portion 79 shows the voltage induced in the secondary coil when current again begins to flow through the primary coil due to the switching of transistor 71 to its conductive state.

The current flowing through secondary coil 54 produces discontinuous, exponentially-decaying signals which give rise to time-varying magnetic fields, electrical fields and electromagnetic radiation. Since secondary coil 54 is cylindrical, it produces magnetic field lines which are nearly parallel throughout the length of the coil and which form loops from one end of the coil to the other. Since coil 54 carries current, it also generates electric fields of unknown configuration. According to Maxwell's wave equation, the secondary coil also radiates electromagnetic waves which are propagated in all directions through space. For example, if the electromagnetic waves are propagated horizontally, they consist of electrical fields oriented in vertical planes and magnetic fields oriented in horizontal planes.

The applicant has discovered a sensor requiring no direct connection to the secondary coil capable of converting one or more of these time-varying electrical phenomenon into a voltage waveform capable of being displayed on an oscilloscope which corresponds to the voltage waveform produced by the secondary coil. A preferred form of sensor capable of achieving this result is shown in FIGS. 2–5 and 7.

The sensor comprises a phenolic frame 80 including sidewalls 81–84 and a top member 86. A depressed rectangular area 90 is formed in top 86 in order to receive the top of cylindrical cover 56. Cut out ribs 92 are formed on a partition 94 in order to receive ribs 57 on distributor cover 56. The underside of partition 94 is clad with a planar copper sensor sheet 88. Area 90 and cut out ribs 92 serves the function of steadying frame 80 when it is placed over the top of the distributor cover in the manner shown in FIG. 2.

A center terminal 96 of a connector 98 is connected to sensor sheet 88 through a coupling capacitor 100 and to chassis ground 32 through a capacitor 104 (FIG. 7). Capacitor 104 provides a means of tuning sensor sheet 88 and, in addition, prevents the build up of a dangerous potential on sensor sheet 88 during the production of high voltage transients by secondary coil 54. Terminal 96 is connected to input 36 of oscilloscope 35 through a conductor 106 which is surrounded by a conductive shield 108 that is connected to chassis ground 32.

It should be noted that the frame 80 is positioned over cover 56 so that copper sheet 88 is arranged parallel to the longitudinal axis 110 of coil 54 and is displaced from the coil by an air gap less than 2 inches. In addition, sensor sheet 88 extends below the top of cover 56 in order to improve the quality of the resulting voltage waveform.

By using the foregoing apparatus, the applicant has found that the voltage produced by secondary coil 54 can be accurately sensed and transmitted to oscilloscope 35 for display on CRT 39. This goil has been achieved without the use of a transformer for sensing the magnetic fields produced by coil 54 or a capacitive probe for sensing the electrical fields of coil 54. Applicant has found that this result can be reached by merely using a single conductive sheet 88 which is connected to the positive input oscilloscope 36 by a single conductor 106. By using this discovery, the voltage waveform produced by secondary coil 54 can be accurately detected and displayed without removing any wires or making any direct electrical connections to the distributor.

Those skilled in the art will recognize that the embodiment described herein may be altered and modified without departing from the true spirit and scope of the invention as defined in the appended claims.

What is claimed is:

1. In a system for testing an internal combustion engine ignition system including a source of common potential, a plurality of fuel ignitors and a distributor including a housing for distributing voltage pulses to the fuel ignitors, said distributor including within the housing a primary coil, means for starting and terminating the flow of electrical current through the primary coil in synchronism with the engine, and a secondary coil magnetically coupled to the primary coil for generating the voltage pulses distributed to the ignitors, improved apparatus for displaying the waveform of the voltage produced by the secondary coil comprising:
   an oscilloscope having a first input and a second input;
   a conductive sensor;
   means for positioning and maintaining the conductive sensor within a predetermined distance of less than two inches from the secondary coil;
   a first conductor for operatively connecting the sensor to the first input of the oscilloscope; and
   a capacitor electrically connected between the first conductor and the source of common potential, whereby the waveform of the voltage produced by the secondary coil is displayed on the oscilloscope.

2. Apparatus, as claimed in claim 1, wherein the secondary coil defines a cylinder having a longitudinal axis and wherein the sensor is parallel to the longitudinal axis.

3. Apparatus, as claimed in claim 2, wherein the sensor comprises means for converting a time-varying electrical phenomenon into corresponding voltages.

4. Apparatus, as claimed in claim 3, wherein the time-varying electrical phenomenon include an electric field, magnetic flux, and electromagnetic radiation.

5. Apparatus, as claimed in claim 2, wherein the sensor is a planar sheet of metal.

6. Apparatus, as claimed in claim 5, wherein the sensor is displaced from the secondary coil by an air gap of less than 2 inches.

* * * * *